United States Patent
Yamaguchi et al.

(10) Patent No.: US 10,790,135 B2
(45) Date of Patent: Sep. 29, 2020

(54) METHOD OF MANUFACTURING SEMICONDUCTOR DEVICE

(71) Applicant: TOKYO ELECTRON LIMITED, Tokyo (JP)

(72) Inventors: Tatsuya Yamaguchi, Nirasaki (JP); Reiji Niino, Nirasaki (JP); Syuji Nozawa, Nirasaki (JP); Makoto Fujikawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/165,228

(22) Filed: Oct. 19, 2018

(65) Prior Publication Data
US 2019/0122883 A1  Apr. 25, 2019

(30) Foreign Application Priority Data
Oct. 23, 2017 (JP) ................. 2017-204744

(51) Int. Cl.
*H01L 21/00* (2006.01)
*H01L 21/20* (2006.01)
(Continued)

(52) U.S. Cl.
CPC .... *H01L 21/02118* (2013.01); *H01L 21/0271* (2013.01); *H01L 21/02205* (2013.01); *H01L 21/02271* (2013.01); *H01L 21/02282* (2013.01); *H01L 21/3105* (2013.01); *H01L 21/31058* (2013.01); *H01L 21/31144* (2013.01); *H01L 21/67115* (2013.01); *H01L 21/76808* (2013.01);
(Continued)

(58) Field of Classification Search
CPC ............. H01L 21/67115; H01L 21/324; H01L 21/68735; H01L 21/68785; H01L 21/02118; H01L 21/02205; H01L 21/02271; H01L 21/76808; H01L 21/76826; H01L 21/76828
USPC .......................................... 438/781
See application file for complete search history.

(56) References Cited

U.S. PATENT DOCUMENTS 6,495,208 B1 * 12/2002 Desu ................. B05D 1/60
257/E21.259
9,414,445 B2   8/2016 Ahmad et al.
(Continued)

FOREIGN PATENT DOCUMENTS

JP         07258370 A  * 10/1995 ......... C08G 18/3225
JP     2005292528 A  * 10/2005

OTHER PUBLICATIONS

Machine translation of JP 07258370; (Year: 1995).*
Translated abstract of JP-2005292528-A (Year: 2005).*

*Primary Examiner* — Sheikh Maruf
(74) *Attorney, Agent, or Firm* — Nath, Goldberg & Meyer; Jerald L. Meyer

(57) ABSTRACT

There is provided a method of manufacturing a semiconductor device by performing a process on a substrate, comprising: forming a sacrificial film made of a polymer having a urea bond on a surface of the substrate by supplying a precursor for polymerization onto the surface of the substrate; subsequently, performing a step of changing a sectional shape of the sacrificial film and a step of adjusting a film thickness of the sacrificial film by heating the sacrificial film; subsequently, performing the process on the surface of the substrate; and subsequently, removing the sacrificial film.

8 Claims, 21 Drawing Sheets

(51) Int. Cl.
*H01L 51/00* (2006.01)
*H01L 21/02* (2006.01)
*H01L 21/768* (2006.01)
*H01L 21/67* (2006.01)
*H01L 21/311* (2006.01)
*H01L 21/3105* (2006.01)
*H01L 21/027* (2006.01)

(52) U.S. Cl.
CPC .. *H01L 21/76826* (2013.01); *H01L 21/76828* (2013.01)

(56) References Cited

U.S. PATENT DOCUMENTS

| | | | | |
|---|---|---|---|---|
| 2003/0196680 | A1* | 10/2003 | Lee | B05D 1/60 134/1.1 |
| 2004/0043631 | A1* | 3/2004 | Beekmann | C23C 16/401 438/781 |
| 2004/0188713 | A1* | 9/2004 | Rantala | H01L 21/02126 257/200 |
| 2006/0051972 | A1* | 3/2006 | Chen | H01L 21/76808 438/763 |
| 2007/0260097 | A1* | 11/2007 | Senkevich | B05D 1/60 585/25 |
| 2007/0264814 | A1* | 11/2007 | Hirai | H01L 21/288 438/617 |
| 2007/0299274 | A1* | 12/2007 | Meiere | C07F 7/025 556/407 |
| 2008/0132597 | A1* | 6/2008 | Nozawa | C07C 265/04 522/71 |
| 2008/0241744 | A1* | 10/2008 | Kanchiku | B41C 1/1008 430/281.1 |
| 2009/0263631 | A1* | 10/2009 | Sakamoto | B82Y 10/00 428/195.1 |
| 2009/0278134 | A1* | 11/2009 | Ohmi | H01L 29/42384 257/72 |
| 2010/0105161 | A1* | 4/2010 | Hirai | H01L 51/0021 438/99 |
| 2011/0281025 | A1* | 11/2011 | Arai | B82Y 10/00 427/130 |
| 2012/0142515 | A1* | 6/2012 | Wu | H01B 3/306 501/32 |
| 2013/0281620 | A1* | 10/2013 | Nishimura | C08G 73/0273 524/612 |
| 2013/0316545 | A1* | 11/2013 | Yamaguchi | H01L 21/02118 438/781 |
| 2014/0015900 | A1* | 1/2014 | Zhang | B41J 2/14 347/45 |
| 2014/0106575 | A1* | 4/2014 | Yoshimoto | B23K 26/0006 438/781 |
| 2014/0187054 | A1* | 7/2014 | Park | H01L 21/02356 438/781 |
| 2014/0322921 | A1* | 10/2014 | Ahmad | H05B 6/80 438/780 |
| 2014/0342167 | A1* | 11/2014 | Tzou | C09D 183/14 428/447 |
| 2014/0370711 | A1* | 12/2014 | Cheng | H01L 21/0273 438/702 |
| 2015/0056819 | A1* | 2/2015 | Wong | H01L 21/67115 438/781 |
| 2015/0091137 | A1* | 4/2015 | Hendricks | H01L 21/02318 257/618 |
| 2015/0221499 | A1* | 8/2015 | Park | H01L 21/0228 257/29 |
| 2015/0287592 | A1* | 10/2015 | Park | C08F 212/08 438/702 |
| 2015/0316850 | A1* | 11/2015 | Someya | C09D 161/12 438/703 |
| 2016/0018735 | A1* | 1/2016 | Tachibana | G03F 7/094 430/323 |
| 2016/0068954 | A1* | 3/2016 | Srinivasan | C09D 183/16 438/503 |
| 2016/0141530 | A1* | 5/2016 | Suga | H01L 51/0529 257/66 |
| 2016/0189953 | A1* | 6/2016 | Park | H01L 21/02203 438/781 |
| 2016/0260916 | A1* | 9/2016 | Koizumi | C23C 18/31 |
| 2016/0342088 | A1* | 11/2016 | Hatakeyama | H01L 21/0337 |
| 2017/0323784 | A1* | 11/2017 | Faguet | C23C 16/48 |

* cited by examiner

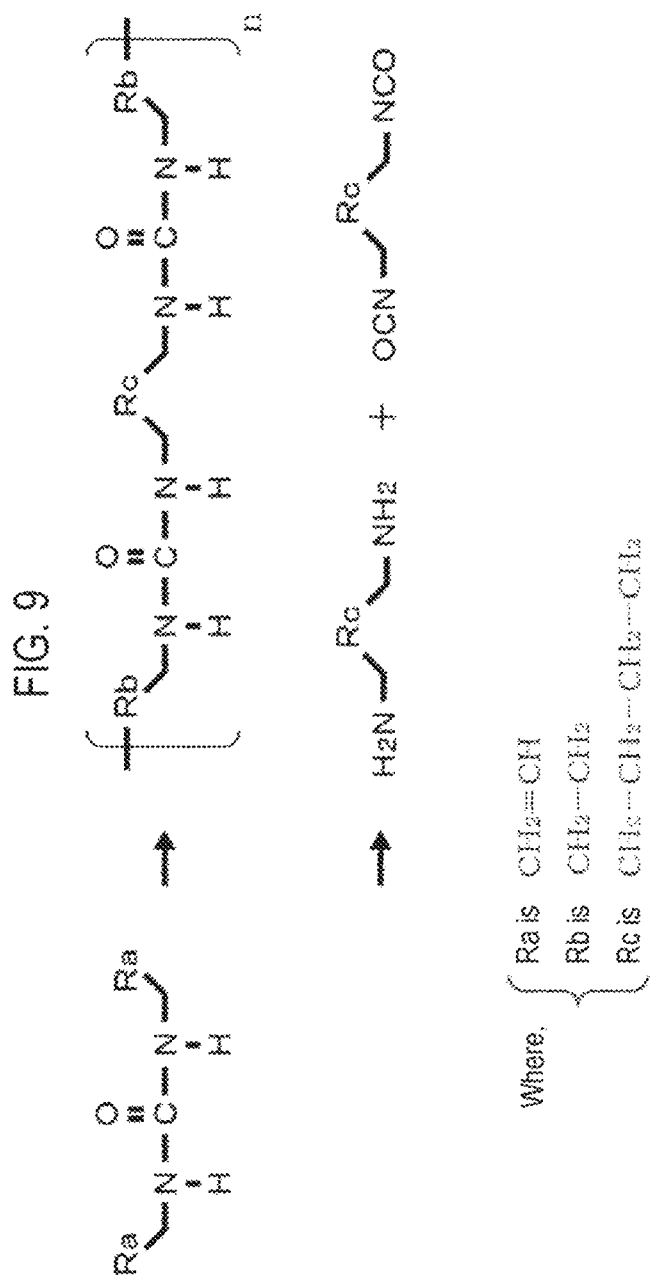

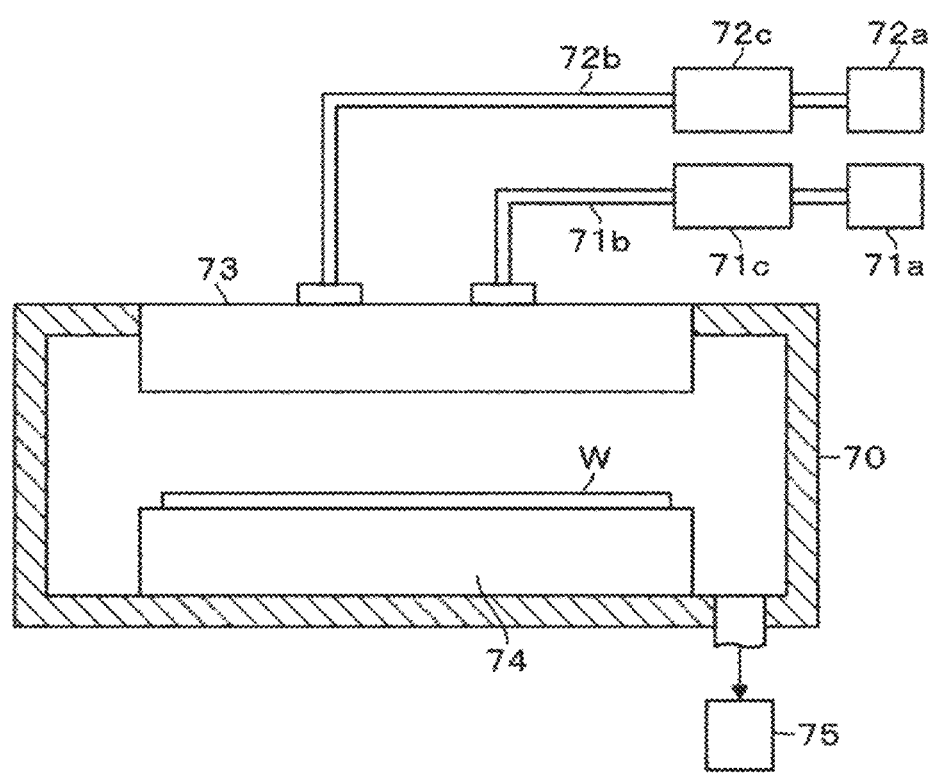

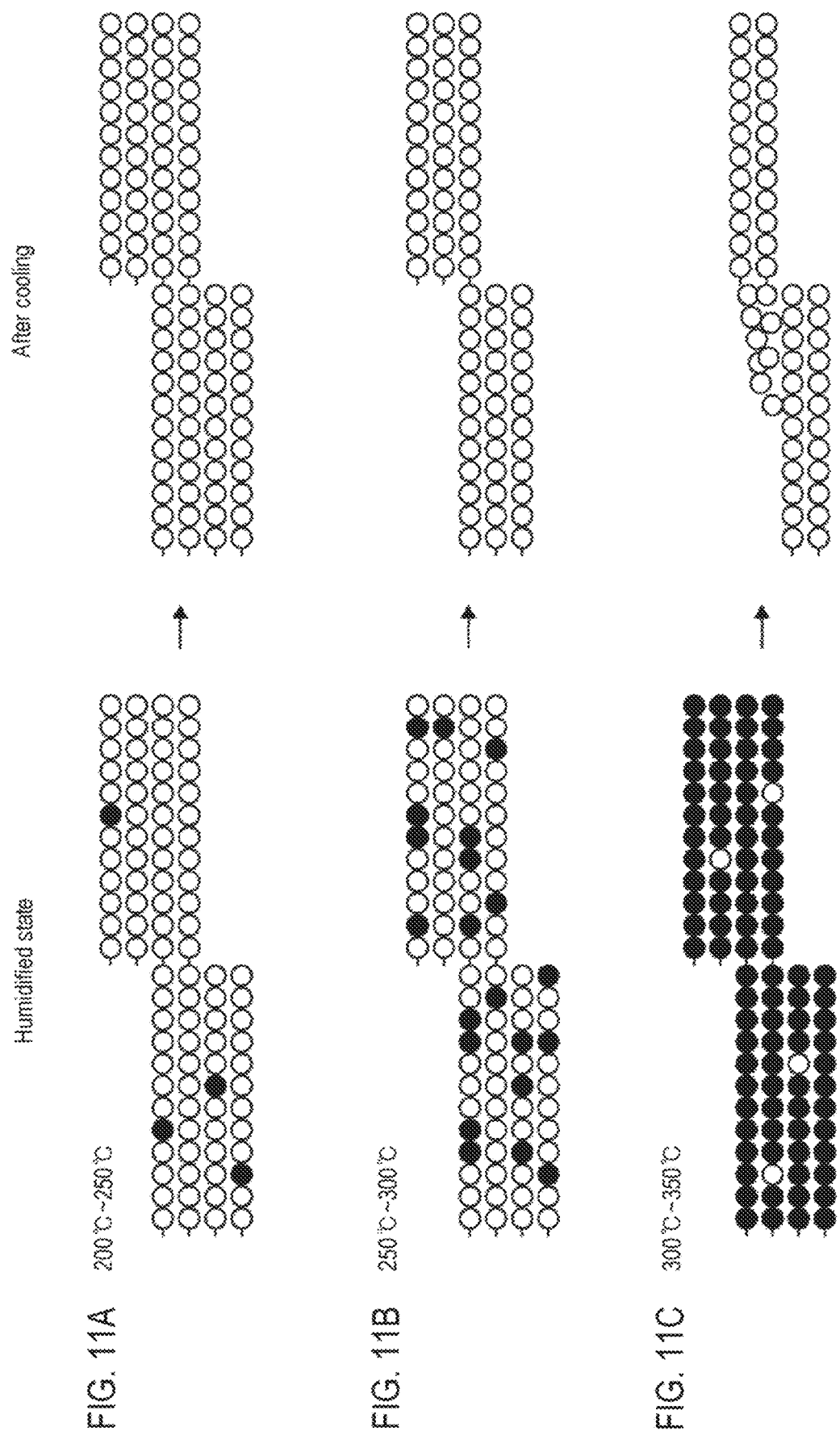

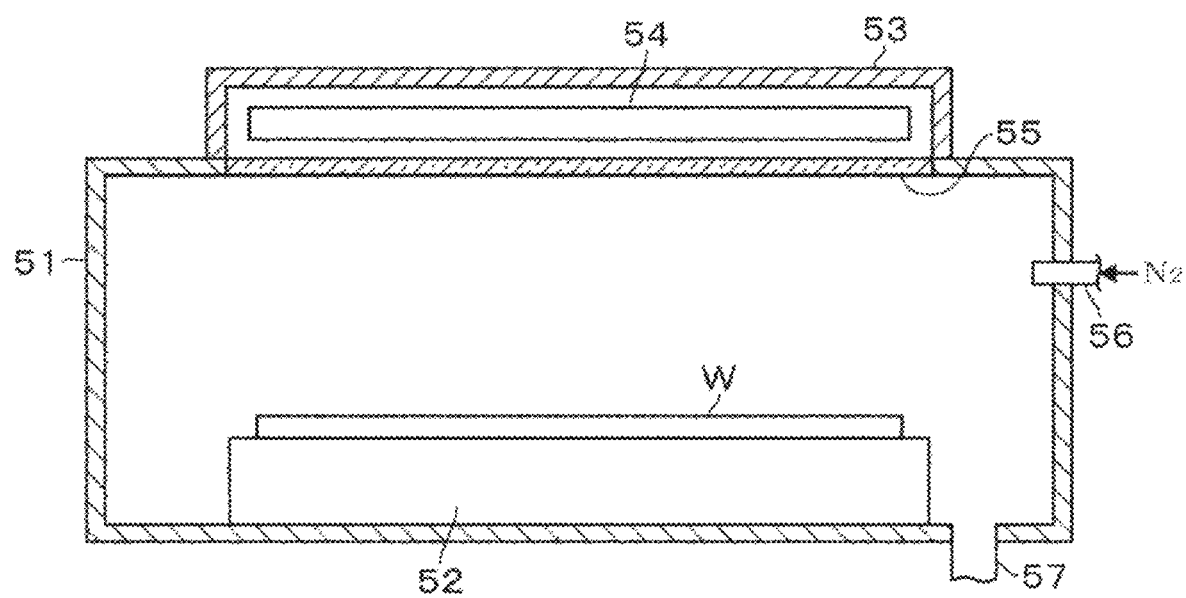

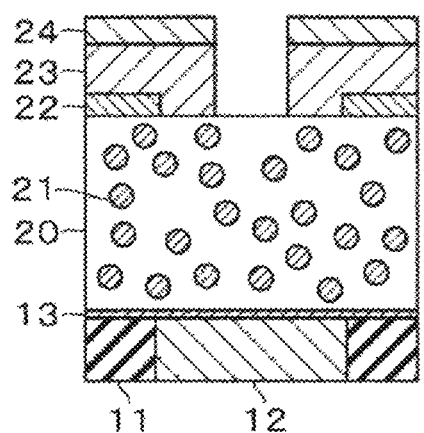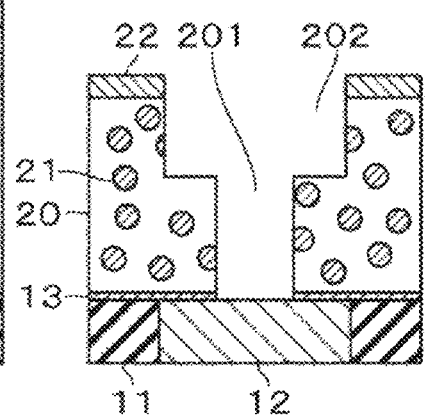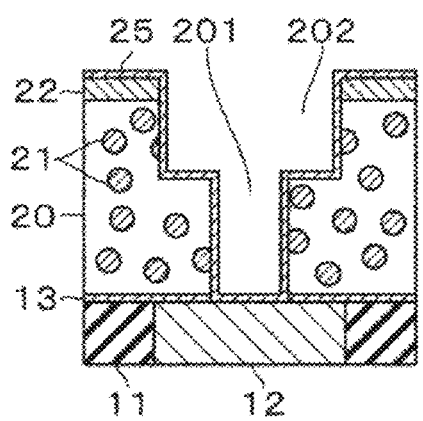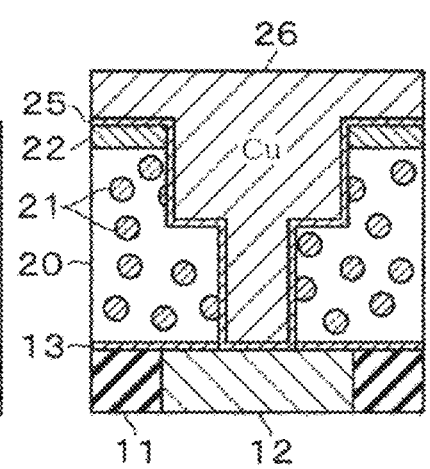

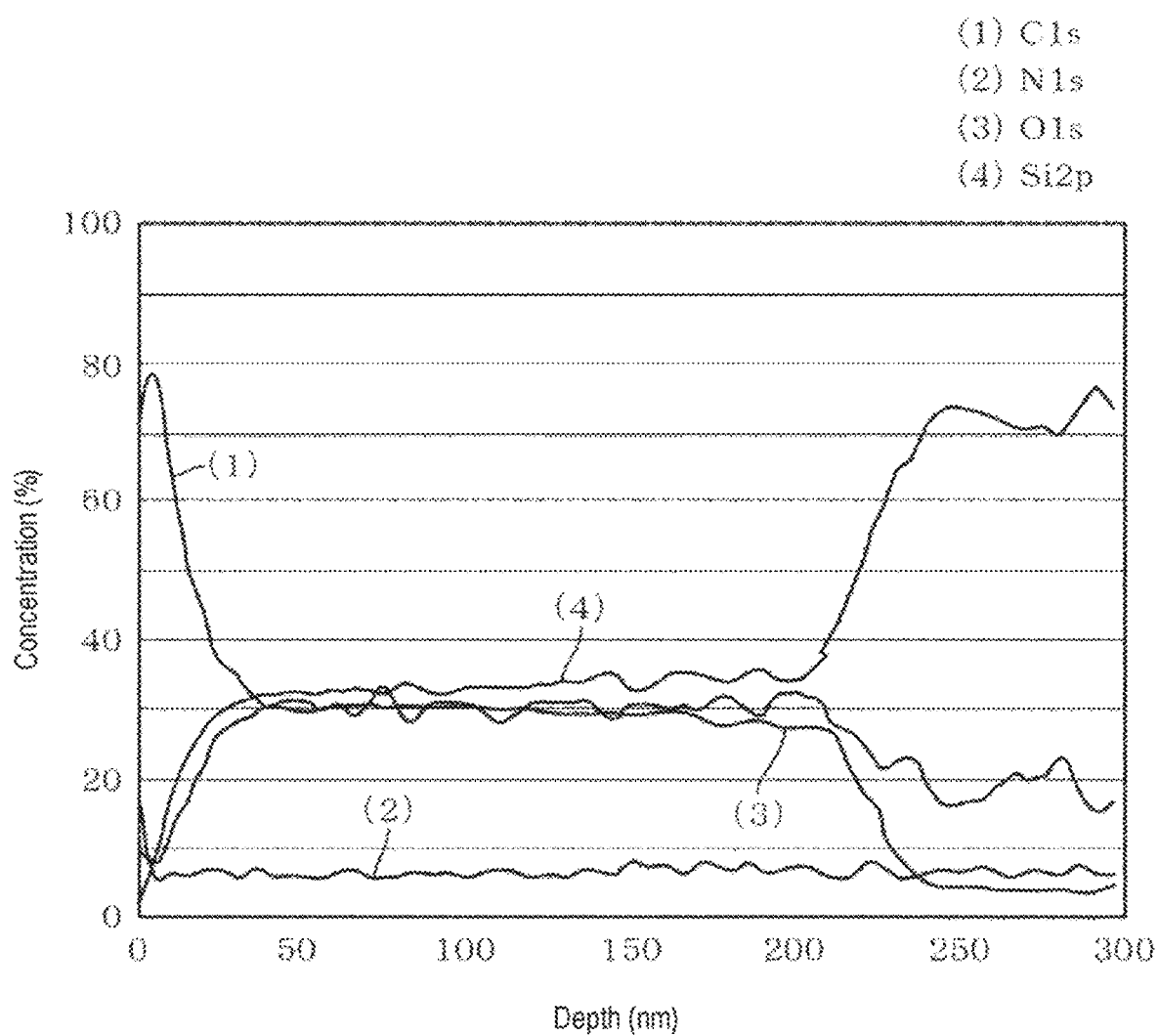

METHOD OF MANUFACTURING SEMICONDUCTOR DEVICE

CROSS-REFERENCE TO RELATED APPLICATION

This application is based upon and claims the benefit of priority from Japanese Patent Application No. 2017-204744, filed on Oct. 23, 2017, the entire contents of which are incorporated herein by reference.

TECHNICAL FIELD

The present disclosure relates to a technique for manufacturing a semiconductor device using a sacrificial film.

BACKGROUND

In a process of manufacturing a semiconductor device, a film called a sacrificial film may be often used. Although the sacrificial film is used in the manufacturing process, it is removed during the manufacturing process. Thus, the sacrificial film is not to be included in a semiconductor device as a product. As the sacrificial film, there are an organic film used to form an intermediate mask on a underlying layer below a resist mask in a corresponding relationship with the resist mask, an organic film used as an intermediate film for separating a trench and a via hole in dual damascene, or the like.

Further, as the sacrificial film, for example, there is known PMMA (acrylic resin) or the like which is filled beforehand in a hole portion of a porous low dielectric constant film formed on a substrate and is removed by performing a process such as etching on the low dielectric constant film, heating the substrate, supplying a solvent and further supplying a microwave.

With miniaturization, three-dimensionalization and complication of semiconductor devices, there is a need to process a formed sacrificial film. For example, when a sacrificial film is formed on a substrate having a stepped portion (concave, convex, etc.) formed on the surface thereof, there is a case where another stepped portion transferred by the stepped portion of the substrate remains in the surface of the sacrificial film depending on a degree of the stepped portion or a thickness of the sacrificial film. In this case, an optical error may occur when exposing a resist laminated on the sacrificial film. This requires smoothing the surface of the sacrificial film. For this reason, the film thickness of an organic film is set to such a thickness that the influence of the shape on the underlying layer disappears. However, in a case of forming a film using a precursor gas, it takes a long period of time to form the film so as to increase the film thickness, which may cause a decrease in throughput. In addition, when trying to perform a so-called reflow by heating using a resin as an organic film, the resin will be deteriorated by the heating. When attempting to use a heat-resistant resin such as polyamide, polyimide or the like to adjust the resin shape by melting the resin, the resin shape may be adjusted by heat and the heat resistance may be also obtained. However, a polymer having a melting point has low crystallinity. Thus, sufficient chemical resistance cannot be obtained. Therefore, it cannot be said that such polymer is an advantageous material.

In the above method of filling PMMA in the hole of the porous low dielectric constant film, the PMMA enters the hole by forming a film on the surface of the low dielectric constant film using a precursor gas. However, such a filling is insufficient. Therefore, the PMMA is heated and melted to perform sufficient filling. However, even in this case, there is a problem that the PMMA is deteriorated due to heating of the substrate.

Further, after forming a sacrificial film, when adjusting a film amount of the sacrificial film (a height position of the surface of the sacrificial film), etching by plasma or the like is necessary, which may result in an increase in the number of processes.

Therefore, it can be said that the current sacrificial film would become inconvenient in a manufacturing process of a semiconductor manufacturing apparatus in the future.

SUMMARY

Some embodiments of the present disclosure provide a technique capable of easily adjusting a shape and film amount of a sacrificial film when manufacturing a semiconductor device using the sacrificial film, which can contribute to simplification of processes.

According to one embodiment of the present disclosure, there is provided a method of manufacturing a semiconductor device by performing a process on a substrate, which includes: forming a sacrificial film made of a polymer having a urea bond on a surface of the substrate by supplying a precursor for polymerization onto the surface of the substrate; subsequently, performing a step of changing a sectional shape of the sacrificial film and a step of adjusting a film thickness of the sacrificial film by heating the sacrificial film; subsequently, performing the process on the surface of the substrate; and subsequently, removing the sacrificial film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is an explanatory view showing how a monomer having a urea bond is crosslinked to produce a polymer having a urea bond.

FIG. 10 is a cross-sectional view showing an apparatus for producing a polymer having a urea bond by allowing isocyanate and amine to react with each other in a vapor state.

FIGS. 11A to 11C are explanatory views schematically showing a state of a film at each heating temperature when a portion of a polyurea film is depolymerized and then cooled.

FIG. 12 is a cross-sectional view showing a heating device for heating a substrate on which a polyurea film is formed.

FIGS. 17A to 17D are explanatory views showing a specific example of processes of the semiconductor device manufacturing method according to the third embodiment of the present disclosure.

FIG. 22 is a scanning electron microscope photograph showing a cross section of a substrate when a polyurea film is formed on the substrate and is then heated, the substrate having a hole formed therein.

DETAILED DESCRIPTION

Reference will now be made in detail to various embodiments, examples of which are illustrated in accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Outline of Embodiments of the Present Disclosure

Outlines of first to third embodiments of the present disclosure will be first described, followed by specific examples.

First Embodiment

Figure 1:
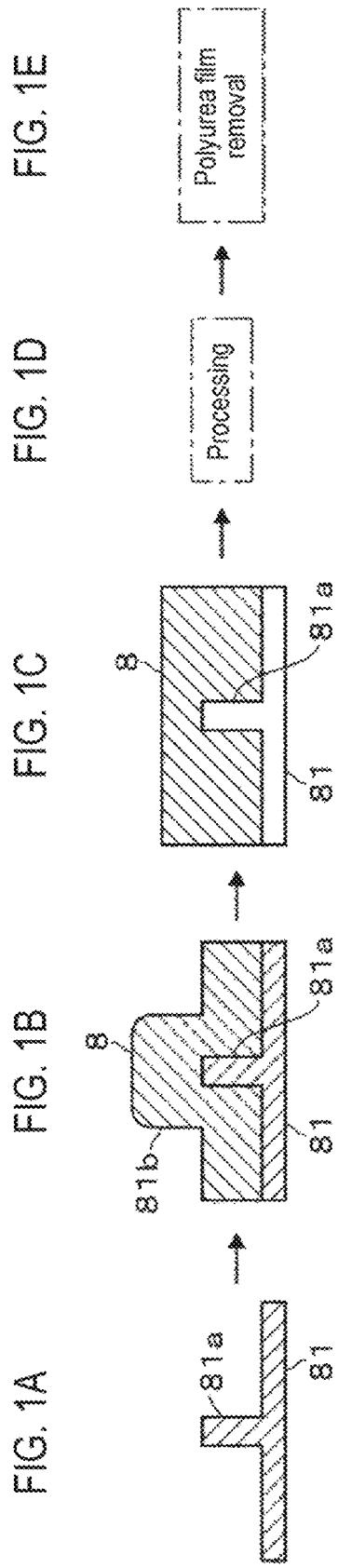
FIGS. 1A to 1E are explanatory views showing an outline of an example of processes of a semiconductor device manufacturing method according to a first embodiment of the present disclosure.
Figure 5:
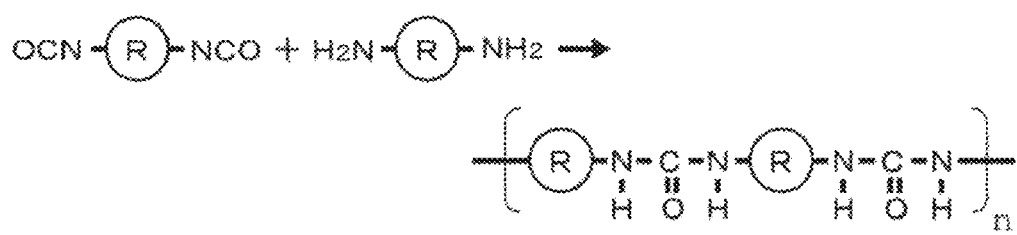
FIG. 5 is an explanatory view showing how a polymer having a urea bond is produced by a copolymerization-based reaction.
Figure 6A:
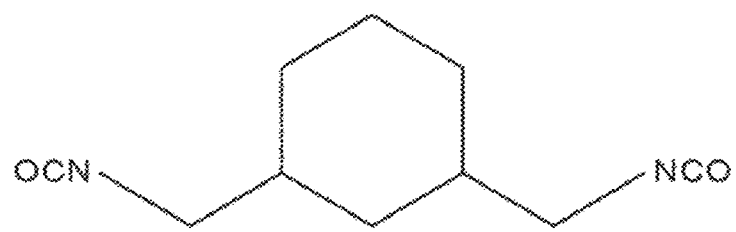
FIGS. 6A and 6B are molecular structure diagrams showing an example molecular structure of isocyanate.
Figure 6B:
Figure 7A:
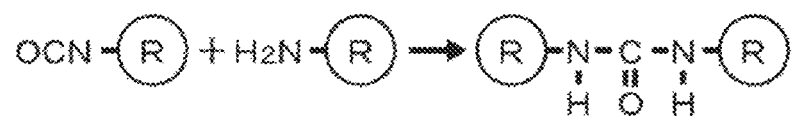
FIGS. 7A to 7D are explanatory views showing reaction by which a polymer having a urea bond is changed to an oligomer.
Figure 7B:
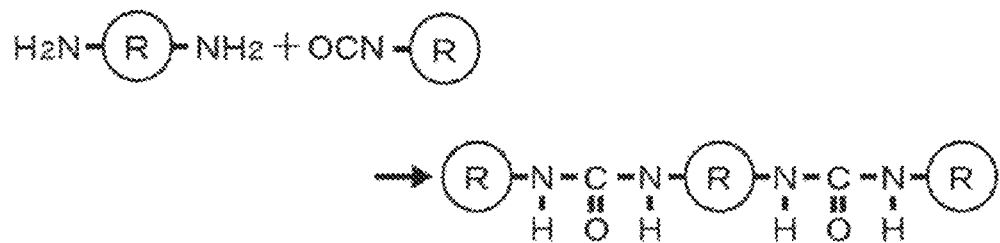
Figure 7C:
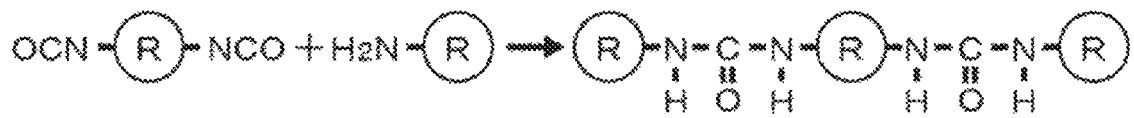
Figure 7D:
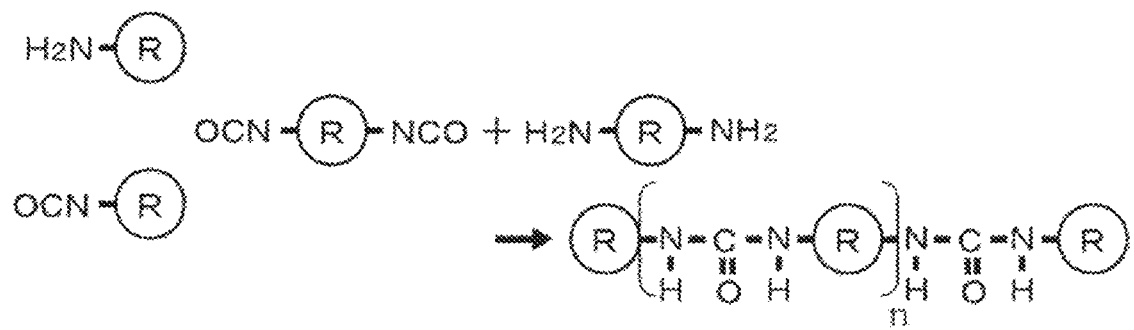

The first embodiment is directed to a method of forming a sacrificial film on a stepped substrate having stepped portions formed on the surface thereof, for example, a silicon wafer subjected to a predetermined film-forming process and an etching process. FIGS. 1A to 1E show an example of the method. In the example of FIGS. 1A to 1E, a polyurea film 8 as a polymer is formed on a substrate 81 (FIG. 1A) on which a convex portion 81a is formed (FIG. 1B). For example, as shown in FIG. 5, the polyurea film can be produced by copolymerization using isocyanate and amine. In FIG. 5, R is, for example, an alkyl group (a linear alkyl group or a cyclic alkyl group) or an aryl group, and n is an integer of two or more. Examples of the isocyanate may include an alicyclic compound, an aliphatic compound, an aromatic compound or the like. An example of the alicyclic compound may include 1,3-bis(isocyanatomethyl)cyclohexane (H6XDI) as shown in FIG. 6A. An example of the aliphatic compound may include hexamethylenediisocyanate as shown in FIG. 6B. An example of the amine may include 1,3-bis(aminomethyl)cyclohexane (H6XDA).

A CVD apparatus for forming a polyurea film by reacting a precursor monomer with a gas (in a vapor deposition polymerization) is shown in FIG. 10. In FIG. 10, reference numeral 70 denotes a vacuum container in which a vacuum atmosphere is defined. Reference numerals 71a and 72a denote precursor supply sources in which isocyanate and amine, which are precursor monomers staying in a liquid state, are received, respectively. The isocyanate liquid and the amine liquid are vaporized by vaporizers 71c and 72c respectively installed in supply pipes 71b and 72b and are introduced into a shower head 73 which is a gas discharge part. The shower head 73 has a number of discharge holes formed in the lower surface thereof and is configured to discharge the isocyanate and the amine, which stay in a vapor state, into a treatment atmosphere from the respective discharge holes. A silicon wafer W as a substrate having a processed surface is mounted on a mounting table 74 provided with a heating mechanism.

As a method of forming the polyurea film 8 on the substrate 81, a method of alternately supplying an isocyanate vapor and an amine vapor onto the substrate 81 may be employed. In this case, the method may include stopping the supply of the isocyanate vapor, evacuating the interior of the vacuum container 70, followed by supplying the amine vapor into the vacuum container 70, and subsequently, stopping the supply of the amine vapor, evacuating the interior of the vacuum container 70 and supplying the isocyanate vapor into the vacuum container 70 may be employed. Alternatively, the method may include stopping the supply of one of the vapors and subsequently supplying the other vapor, and stopping the supply of the other vapor and subsequently supplying the one vapor. In some embodiments, the method may include simultaneously supplying the isocyanate vapor and the amine vapor onto the substrate 81. In the method using the isocyanate vapor and the amine vapor, the substrate 81 is heated at a temperature ranging from, for example, room temperature to a temperature slightly lower than a temperature at which the polyurea film depolymerizes, for example, at a temperature ranging from 20 to 200 degrees C., to promote a polymerization reaction.

Figure 8A:
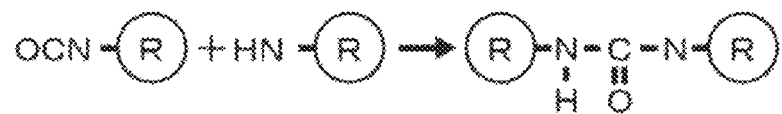
FIGS. 8A and 8B are explanatory views showing how secondary amine is used to produce a polymer having a urea bond.
Figure 8B:
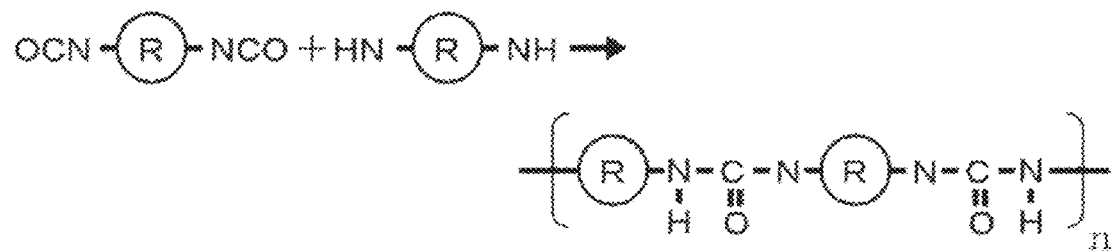

Further, as shown in FIGS. 7A to 7D, monofunctional molecules may be used as the precursor monomer. Furthermore, as shown in FIGS. 8A and 8B, isocyanate and secondary amine may be used as the precursor monomer. In this case, bonds contained in a produced polymer are urea bonds. Then, the precursor monomer containing the urea bonds may be polymerized to obtain a polyurea film. FIG. 9 shows such an example, in which polymerization occurs by giving light energy to the precursor monomer by irradiating the precursor monomer with light, for example, an ultraviolet ray, thereby producing a polyurea film.

Returning to FIGS. 1A to 1E, since the convex portion 81a is formed on the substrate 81, a convex portion 81b, which is a stepped portion onto which the convex portion 81a is transferred, remains on the surface of the polyurea film 8. Therefore, by heating the substrate 81 to, for example, 300 degrees C., a portion of the polyurea film 8 is depolymerized as shown in FIG. 1C so as to impart fluidity to the film 8. Thus, the polyurea film 8 is planarized. Further, a portion of the polyurea film 8 is changed to a monomer and is vaporized by the heating. Thus, the portion of the polyurea film 8 is removed by adjusting the heating time, so that a thickness of the polyurea film 8 is decreased. That is to say, the planarization process, which is a step of adjusting the sectional shape of the polyurea film 8, is performed by heating the polyurea film 8, and a film amount adjustment process (film thickness adjustment process), which is a step of adjusting the film thickness of the polyurea film 8 to a film thickness suitable for a subsequent process, is performed. By planarizing the surface of the polyurea film 8, it is possible to suppress occurrence of an optical error upon exposure of a resist laminated on the polyurea film 8 in a subsequent process, for example.

In the polyurea film, a reversible equilibrium reaction between polymerization and depolymerization is established and the depolymerization is dominant as temperature rises. For example, at a temperature of 300 to 350 degrees C., the equilibrium is biased to molecular depolymerization. Therefore, a monomer formed by the depolymerization is vaporized and the film is vaporized with time and is eventually lost.

FIGS. 11A to 11C schematically show states after a polyurea film is heated for a predetermined period of time for each heating temperature zone, in which a group of white circle portions indicates polymers and a group of black circle portions indicates monomers. FIGS. 11A to 11C correspond to heating temperature zones of, for example, 200 to 249 degrees C., 250 to 299 degrees C., and 300 to 350 degrees C., respectively. As can be seen from FIGS. 11A to 11C, upon observation of the heated polyurea film after a certain period of time, a higher heating temperature provides the larger number of monomers.

When depolymerization occurs, the produced monomers are vaporized with time and the number of the produced monomers is also increased, so that the polyurea film is eventually lost. A period of time taken until the polyurea film is eventually lost becomes shorter as the heating temperature increases. When depolymerization occurs in a portion of the polyurea film, the polyurea film takes on fluidity. A heating time taken until the fluidity occurs becomes shorter as the heating temperature increases. Therefore, when the polyurea film 8 is heated to, for example, 300 degrees C., the produced monomers are vaporized from the surface of the polyurea film 8 by depolymerization so that the film thickness is reduced. Further, monomers are newly produced inside the film. Therefore, the polyurea film 8 is fluidized and planarized, adjusting the film thickness. Although 300 degrees C. has been described as an example of the heating temperature, the heating temperature and the heating time may be set with the balance between the degree of unevenness of the surface of the polyurea film 8 formed in the stage of FIG. 1B and the adjustment amount of the film thickness.

For example, as shown in FIG. 12, the process of heating the substrate 81 may be carried out by mounting a wafer W on a mounting table 52 inside a processing container 51 and heating the substrate 81 with an infrared lamp 54 installed in a lamp house 53. In FIG. 12, reference numeral 55 denotes a transmission window, reference numeral 56 denotes a supply pipe for supplying a nitrogen gas, and reference numeral 57 denotes an exhaust pipe. The heating process may be performed in a process atmosphere, for example, a vacuum atmosphere (in this case, a vacuum exhaust mechanism is connected to the exhaust pipe 57 and a vacuum container is used as the processing container 51) or a normal pressure atmosphere while supplying the nitrogen gas as an inert gas into processing container 51. The infrared lamp 54 has been described to be used as a heating mechanism but not limited thereto. As an example, a heater installed in the mounting table 52 may be used as the heating mechanism.

After the adjustment of the sectional shape of the polyurea film 8 as the sacrificial film (in this example, the planarization of the stepped portion of the surface) and the film thickness adjustment are completed in this manner, a process using the sacrificial film is performed (FIG. 1D). For example, this process can be performed using the polyurea film 8 as an etching mask. In this case, a resist film is laminated on the polyurea film 8, and the polyurea film 8 is etched using the resist mask to form an etching mask. Thereafter, an underlying film to be etched is etched using the etching mask. A series of processes using the sacrificial film is completed in this way. Thereafter, the polyurea film 8 is removed. As a method of removing the polyurea film 8, there may be a method which includes heating the substrate 81 to, for example, 350 degrees C. to depolymerize and vaporize the polyurea film 8. There may be also another method which includes ashing away the polyurea film 8 by plasma obtained by activating an oxygen-containing gas, for example, an oxygen gas.

Figure 2:
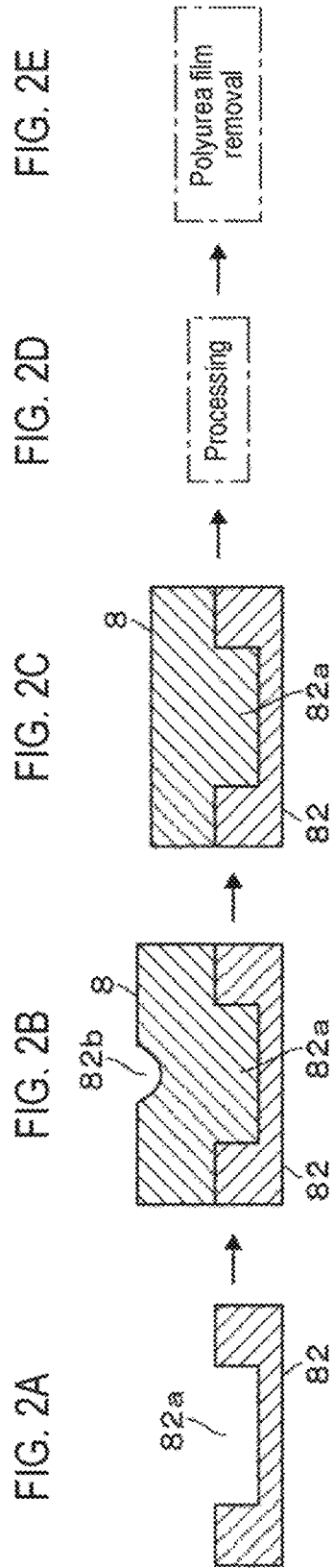
FIGS. 2A to 2E are explanatory views showing an outline of another example of processes of the semiconductor device manufacturing method according to the first embodiment of the present disclosure.

FIGS. 2A to 2E show another example of the first embodiment in which a sacrificial film is formed on a stepped substrate having a stepped portion formed on the surface thereof. In this example, a polyurea film 8 as a polymer is formed on a substrate 82 (FIG. 2A) having a concave portion 82a formed on the surface thereof (FIG. 2B). A concave portion 82b, which is a stepped portion onto which the concave portion 81b is transferred, remains on the surface of the polyurea film 8. Therefore, by heating the stepped substrate 82 to, for example, 300 degrees C., fluidity is imparted to the polyurea film 8 as shown in FIG. 2C, thereby planarizing the polyurea film 8. Further, as in the previous example, the heating time is adjusted to decrease the film thickness of the polyurea film 8.

According to the first embodiment, even when the transferred portion corresponding to the stepped portion formed in the lower portion of the sacrificial film 8 remains on the surface of the sacrificial film (the polyurea film 8), the sacrificial film can be planarized by heating. It is therefore possible to reduce a film thickness of the sacrificial film at the time of formation of the sacrificial film. In a case of forming an organic film on a stepped substrate using a precursor gas, a film thickness of the organic film when a stepped portion is removed from a surface of the organic film and the organic film is planarized, is for example, approximately three times as large as the stepped portion. However, when the planarization is performed using the polyurea film 8, it can be expected that a film thickness of the polyurea film 8 becomes about half of the film thickness of the conventional organic film.

Even when the planarization, which is the shape adjustment process (sectional shape adjustment process), is performed by the heating, the polyurea film 8 is not changed in quality. In addition, since the film amount adjustment process can be performed in addition to the shape adjustment process of the sacrificial film by heating, etch-back by plasma or the like is unnecessary, avoiding complication of the process, which contributes to an increase in throughput. Further, since the polyurea film 8 has high chemical resistance, it is advantageous in this respect.

Second Embodiment

Figure 3:
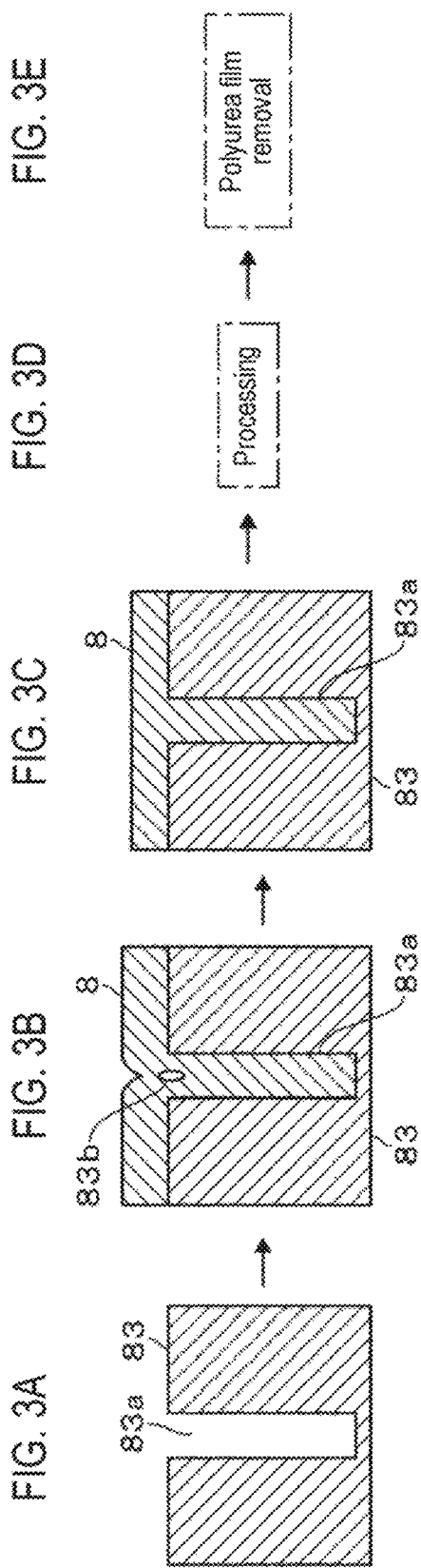
FIGS. 3A to 3E are explanatory views showing an outline of processes of a semiconductor device manufacturing method according to a second embodiment of the present disclosure.

The second embodiment is directed to a method of forming a sacrificial film as a protective film on a surface of a substrate on which a concave portion such as a narrow and deep hole or groove is formed. FIGS. 3A to 3E show an example of such a method. In the example of FIGS. 3A to 3E, a polyurea film 8 as a polymer is formed on a substrate 83 (FIG. 3A) having a concave portion 83*a* formed on the surface thereof, for example, according to the method described in the first embodiment (FIG. 3B). The concave portion 83*a* has a hole diameter or groove width of, for example, 100 nm to 10 nm and an aspect ratio of, for example, 2 or more. When the polyurea film 8 is formed on the substrate 83 on which the concave portion 83*a* is formed, the entrance of the concave portion 83*a* is clogged before the concave portion 83*a* is fully filled with the polyurea film 8, which results in formation of a cavity (void or seam) 83*b* inside the concave portion 83*a*. In addition, a recess is formed in the surface of the polyurea film 8 at a position corresponding to the concave portion 83*a*.

If the cavity 83*b* is formed in the concave portion 83*a*, the polyurea film 8 may not function as a protective film in some cases. For example, in a case where a hard mask (e.g., a mask made of a metal compound such as titanium) is formed at a location other than the concave portion 83*a*, dry etching is performed, and then the hard mask is removed with a chemical solution, if a cavity such as a void exists near the surface of the polyurea film 8, the chemical solution may reach the cavity and spread and penetrate into the cavity, which may result in deterioration of the protective performance of the protective film.

Therefore, by heating the substrate 83 to depolymerize a portion of the polyurea film 8, the void in the concave portion 83*a* is filled with polyurea (FIG. 3C). By heating the polyurea film 8 to, for example, 280 degrees C., the portion of the polyurea film 8 is depolymerized to fill the void 83*b* with the monomer. Further, by cooling the polyurea film 8, the monomer is polymerized to fill the void 83*b*. At this time, the film thickness of the polyurea film 8 is also reduced by depolymerization and the surface thereof is also planarized. That is to say, by imparting fluidity to the polyurea film 8, the film thickness adjustment process, the surface planarization process and the void filling process are performed.

The time required for filling is shortened by increasing the heating temperature. However, the polymer is depolymerized from the surface of the polyurea film 8 so that a rate of film reduction is increased. This makes it difficult to finely adjust the film thickness. Thus, the heating temperature and the heating time are set according to the film thickness at the time of forming the polyurea film 8 and the adjustment amount of the film thickness of the polyurea film 8.

By eliminating the void formed in the polyurea film 8 in this manner, the chemical resistance is enhanced. Further, after the cavity formed in the concave portion 83*a* is eliminated, the film amount adjustment may be performed to reduce the film thickness of the polyurea film 8 at the same temperature as or different from the temperature applied during the process of filling the concave portion 83*a*. A process shown in FIG. 3D performed after the protective film is formed corresponds to a series of processes including, for example, formation of an etching mask, dry etching and chemical cleaning. Thereafter, as described above, the polyurea film 8 is removed (FIG. 3E).

Third Embodiment

Figure 4:
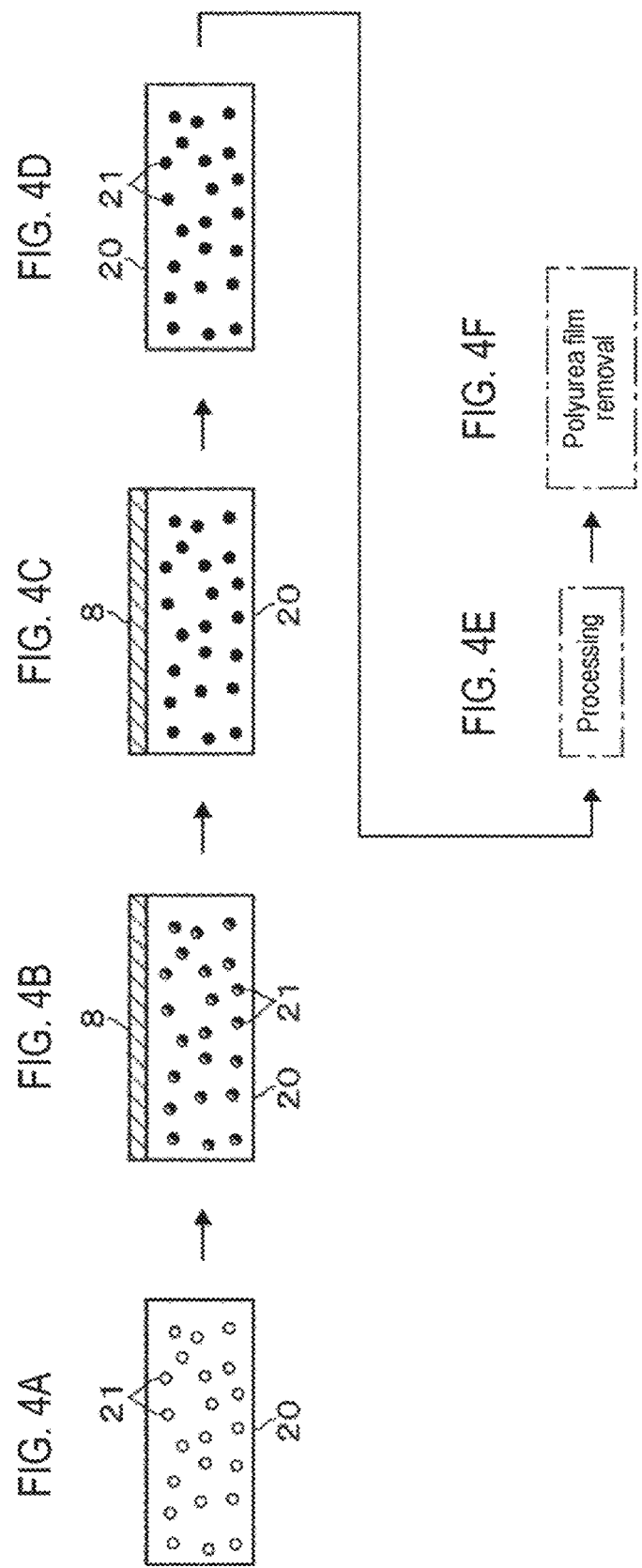
FIGS. 4A to 4F are explanatory views showing an outline of processes of a semiconductor device manufacturing method according to a third embodiment of the present disclosure.

The third embodiment is directed to a method of forming a sacrificial film as a protective film by penetrating a polyurea film into a porous low dielectric constant film. FIGS. 4A to 4F show an example of the method. In the example of FIGS. 4A to 4F, a polyurea film 8 is formed on a low dielectric constant film 20 (FIG. 4A) formed of an SiOC film (carbon and oxygen-containing silicon oxide film) serving as an interlayer insulating film, for example, according to the method described in the first embodiment (FIG. 4B). The SiOC film is formed by, for example, a CVD method using plasmarized diethoxymethylsilane (DEMS). Regarding the formation of the polyurea film 8, for example, when an isocyanate gas and an amine gas are alternately supplied into the low dielectric constant film 20, the gases penetrate into holes 21 formed inside the low dielectric constant film 20, the polyurea film 8 is laminated on the low dielectric constant film 20, and polyurea (indicated by black portions) enters the respective holes 21.

At this point, the filling of the holes 21 with polyurea is insufficient. That is to say, microscopically, voids remain in the holes 21. Therefore, by heating the substrate to depolymerize a portion of the polyurea films 8 and cooling the substrate, the holes 21 are sufficiently filled with polyurea (FIG. 4C). Subsequently, in the polyurea film 8, a portion laminated on the low dielectric constant film 20 is depolymerized and removed by heating (FIG. 4D). In this case, the series of processes shown in FIGS. 4B to 4D may be carried out continuously at the same heating temperature. Alternatively, after the holes 21 are sufficiently filled with polyurea, the portion laminated on the low dielectric constant film 20 may be removed by changing the heating temperature, for example, by increasing the heating temperature.

Subsequently, a process is performed on the substrate including the low dielectric constant film 20 (FIG. 4E). Examples of the process may include etching the low dielectric constant film 20 to form a via hole and trench, and filling such concave portions with wiring metal. The process of forming the wiring will be described in detail with a specific example to be described later. Thereafter, the substrate is heated to remove the polyurea (the polyurea film 8) filled in the low dielectric constant film 20 by depolymerization (FIG. 4F). In this example, the process from the state where the polyurea enters the holes 21 (FIG. 4B) to the state where the holes 21 are filled with the polyurea (FIG. 4C) corresponds to a step of adjusting the sectional shape of the sacrificial film. A process of removing the polyurea film 8 laminated on the low dielectric constant film 20 corresponds to a step of adjusting the film amount of the sacrificial film.

According to the third embodiment, the holes 21 formed in the low dielectric constant film 20 are filled with polyurea during etching and ashing performed on the low dielectric constant film 20 so that the low dielectric constant film 20 is protected. It is therefore possible to suppress occurrence of damage to the low dielectric constant film 20, for example, due to plasma. In addition, as will be described later, since the polyurea film 8 formed on the low dielectric constant film 20 is removed, it is possible to avoid a problem during a CMP process performed after filling the via hole and the trench with copper. Specifically, it is possible to avoid a phenomenon that a surface portion of copper filled in the trench projects slightly more than the low dielectric constant film 20 when CMP is performed in a state where an organic film remains on the low dielectric constant film 20. This problem is presumed to have an adverse effect on the CMP by the components of the organic film.

In the third embodiment, in the method using the precursor monomers which stay in a vapor state, it is preferable that the vapor pressures of the precursor monomers are far apart from each other, for example, they are separated from each other by one digit or more. The reason for this is that, with a combination of vapor pressures close to each other, for example, when amine is diffused into the holes of the low dielectric constant film, it is adsorbed onto the surfaces of the holes, which may deteriorate the efficiency of reaction with isocyanate. An example of the combination of isocyanate and amine between which the difference in vapor pressure is one digit or more may include a combination in which a skeleton molecule obtained by excluding an isocyanate functional group from isocyanate is the same as a skeleton molecule obtained by excluding an amine functional group from amine, that is to say, isocyanate and amine have the same skeleton molecules. For example, the vapor pressure of H6XDA to which an amine functional group is bonded, is higher by one digit or more than the vapor pressure of H6XDI to which an isocyanate functional group is bonded and has the same skeleton molecule as the H6XDA.

Specific Examples of Embodiments of the Present Disclosure

Specific examples of the above-described first and third embodiments will be described below.

Specific Example of First Embodiment

FIGS. 13A to 15C are views showing an example of a specific manufacturing process to which the first embodiment shown in FIGS. 1A to 1E and FIGS. 2A to 2E is applied. This example corresponds to some of a series of processes of embedding wiring metal in an interlayer insulating film made of, for example, SiOCH, using dual damascene.

Figure 13A:
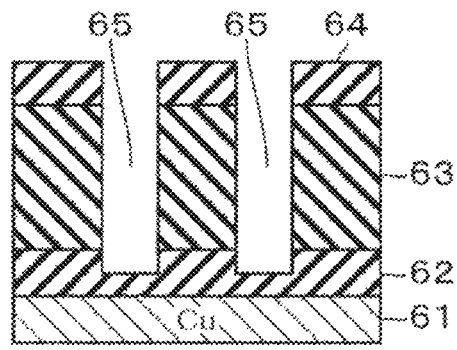
FIGS. 13A to 13C are explanatory views showing a specific example of processes of the semiconductor device manufacturing method according to the first embodiment of the present disclosure.

In a substrate shown in FIG. 13A, a silicon carbide (SiC) film 62 and an interlayer insulating film 63 are laminated in this order on a copper wiring 61 of an underlying circuit, and holes 65 are formed at positions corresponding to via holes using a $SiO_2$ film 64 as a mask.

Figure 13B:
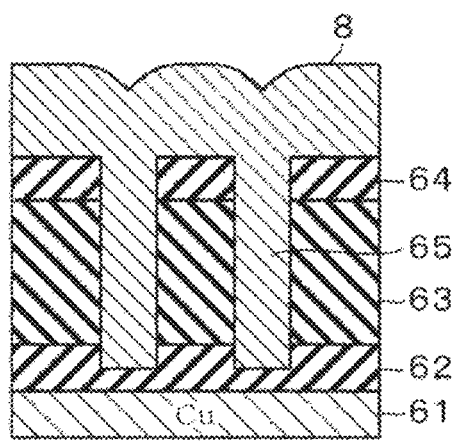
Figure 13C:
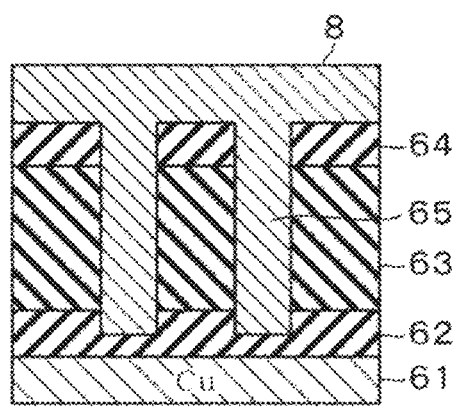

A polyurea film 8 as a sacrificial film is formed on a surface of the substrate, and the holes 65 are filled with the polyurea film 8 (FIG. 13B). The holes 65 as concave portions are transferred on the surface of the polyurea film 8 so that stepped portions are formed on the surface of the polyurea film 8. The surface of the polyurea film 8 is smoothed by heating the substrate as described above. Due to this heating, a portion of the polyurea film 8 is depolymerized and the monomer is vaporized and lost from the surface of the substrate. Thus, the film thickness of the polyurea film 8 is reduced as shown in FIG. 13C (the film amount is adjusted).

Figure 14A:
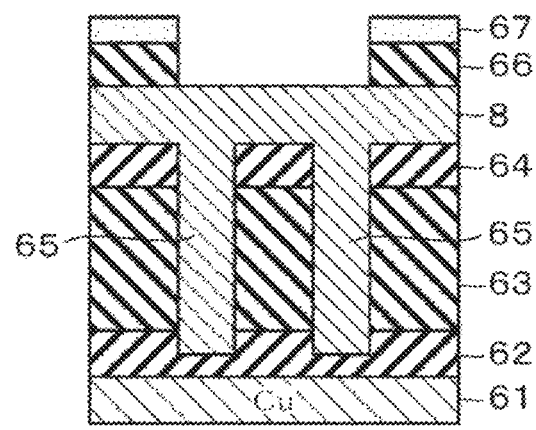
FIGS. 14A and 14B are explanatory views showing a specific example of processes of the semiconductor device manufacturing method according to the first embodiment of the present disclosure.
Figure 14B:
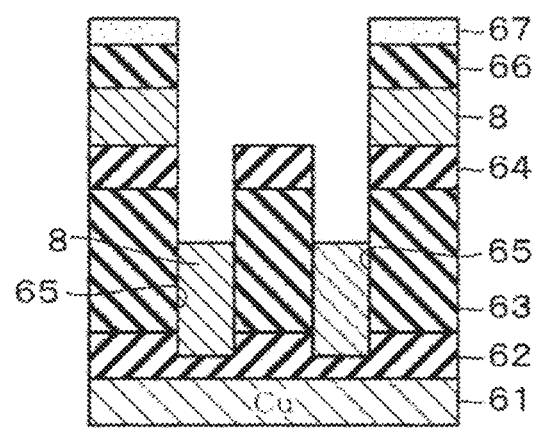

Subsequently, as shown in FIG. 14A, a mask for forming a trench is formed on the polyurea film 8 through a resist mask 67 with a $SiO_2$ film 66 interposed between the a resist mask 67 and the polyurea film 8. Then, as shown in FIG. 14B, the polyurea film 8 is etched to reach a position slightly deeper than a position corresponding to the depth of the respective trench. The etching of the polyurea film 8 can be performed using oxygen-containing plasma, for example, oxygen gas plasma.

Figure 15A:
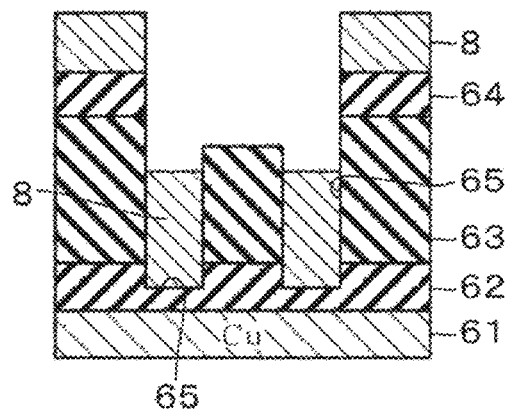
FIGS. 15A to 15C are explanatory views showing a specific example of processes of the semiconductor device manufacturing method according to the first embodiment of the present disclosure.
Figure 15B:
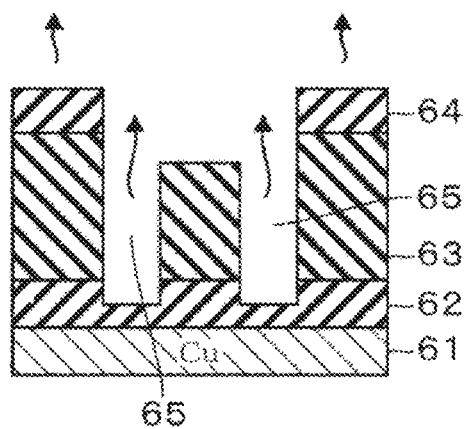
Figure 15C:
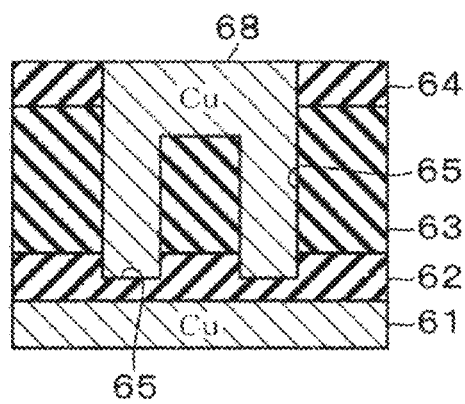

Thereafter, the $SiO_2$ film 66 and a $SiO_2$ film 65 exposed in the concave portion corresponding to the trench are etched away, and the interlayer insulating film 63 exposed in the concave portion corresponding to the trench is etched away to a height position corresponding to the bottom of the trench (FIG. 15A). Thereafter, the polyurea film 8 is removed (FIG. 15B) and the trench and the via hole are filled with a copper wiring 68 (FIG. 15C). The process of removing the polyurea film 8 before filling the copper wiring is carried out by the heating-based depolymerization or the ashing using oxygen-containing plasma as described above.

Specific Example of Third Embodiment

FIGS. 16A to 18B are views showing an example of a specific manufacturing process to which the third embodiment shown in FIGS. 4A to 4F is applied. This example corresponds to some of a series of processes of embedding wiring metal using dual damascene. Reference numeral 11 denotes an interlayer insulating film formed on an underlying layer, reference numeral 12 denotes a copper wiring which is a wiring material embedded in the interlayer insulating film 11, and reference numeral 13 denotes an etching stopper film having a stopper function at the time of etching.

A low dielectric constant film 20 as an interlayer insulating film is formed on the etching stopper film 13. In this example, a SiOC film is used for the low dielectric constant film 20. The low dielectric constant film 20 is porous. Holes 21 formed in the low dielectric constant film 20 are very schematically shown.

Figure 16A:
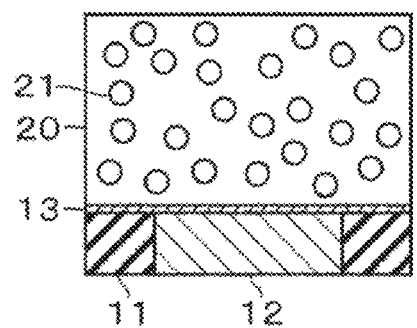
FIGS. 16A to 16D are explanatory views showing a specific example of processes of the semiconductor device manufacturing method according to the third embodiment of the present disclosure.
Figure 16B:
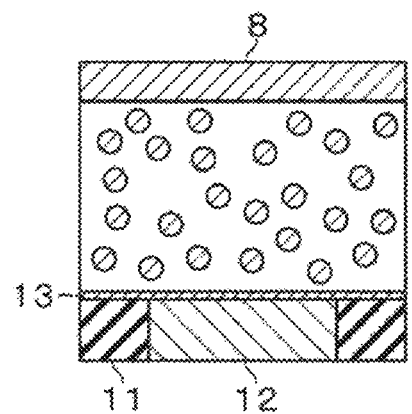
Figure 16C:
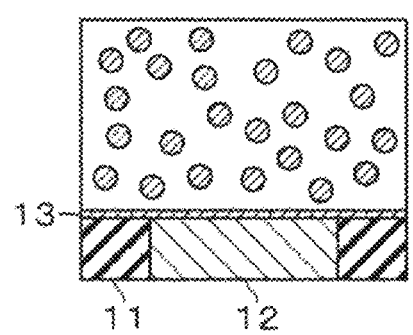

First, the polyurea film 8 is formed on a substrate having a surface structure shown in FIG. 16A as described above. Polyurea is generated inside the holes 21. The polyurea film 8 is laminated on the surface of the low dielectric constant film 20 (FIG. 16B). From the viewpoint of the low dielectric constant film 20 as a whole, it can be said that the polyurea film 8 is formed in the group of holes 21. At this stage, since a gap is formed in each hole 21, the filling of the polyurea is insufficient. The polyurea in each hole 21 is indicated by hatching. Thereafter, the holes 21 are filled with polyurea by heating the substrate as described above. At this time, for example, by continuing the heating, the polyurea film 8 formed on the surface of the low dielectric constant film 20 is lost (FIG. 16C).

Figure 16D:
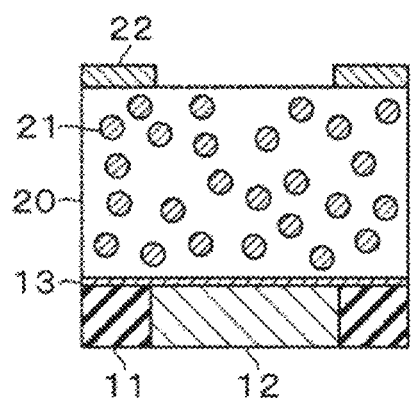

Subsequently, a hard mask 22 formed of, for example, a titanium nitride (TiN) film and having an opened portion corresponding to the trench is formed by a known method (FIG. 16D). A mask film 23 formed of an organic film serving as a mask at the time of etching the via hole and an antireflective film 24 are laminated in this order on the hard mask 22 (FIG. 17A).

Using these masks, a via hole 201 and a trench 202 are formed in this order by a known method and the etching stopper film 13 at the bottom of the via hole 201 is etched away (FIG. 17B). The etching is performed using plasma. Since the polyurea that is a protective film is filled in each hole 21 of the low dielectric constant film 20, plasma damage to the low dielectric constant film 20 is suppressed.

Figure 18A:
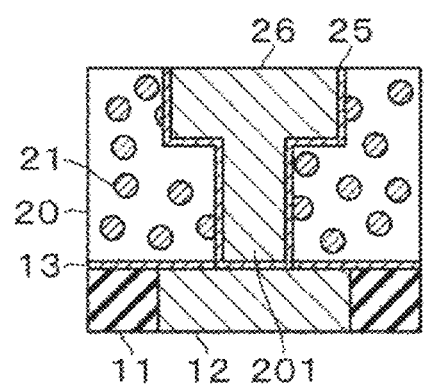
FIGS. 18A and 18B are explanatory views showing a specific example of processes of the semiconductor device manufacturing method according to the third embodiment of the present disclosure.
Figure 18B:
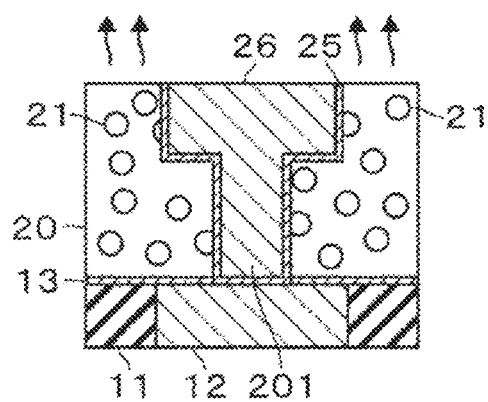

Thereafter, a barrier layer 25 for preventing copper serving as a conductive path (to be described later) from diffusing into the low dielectric constant film 20, which is composed of a laminated film of, for example, Ti and TiON, is formed on inner surfaces of the via hole 201 and the trench 202 (FIG. 17C). Thereafter, a copper 26 is embedded in the via hole 201 and the trench 202 (FIG. 17D). The excess copper 26, the excess barrier layer 25 and the excess hard mask 22 are removed by CMP (Chemical Mechanical Polishing) to form a copper wiring (FIG. 18A). Then, the substrate is heated to, for example, 300 degrees C. or higher to remove the polyurea which is a filling material filling each hole 21 of the low dielectric constant film 20 by depolymerization (FIG. 18B).

In the foregoing descriptions, the method for forming the polyurea film 8 may include supplying one of isocyanate and amine, which stay in a liquid state, onto the substrate by, for example, spin coating so as to permeate into the low dielectric constant film, and subsequently supplying the other of isocyanate and amine, which stay in a liquid state, onto the substrate by the spin coating in the same manner. The spin coating is a generally-used method of applying a chemical solution such as a resist solution or the like onto the surface of a substrate. Specifically, this spin coating is an applying method of attracting the substrate onto, for example, a vacuum chuck, discharging the chemical solution to the center portion of the substrate, and rotating the vacuum chuck at a high speed to spread the chemical solution. Alternatively, the spin coating may be performed by mixing the isocyanate liquid and the amine liquid at the upstream side immediately before a nozzle and discharging the mixture from the nozzle onto the substrate.

In some embodiments, isocyanate (liquid), which is a precursor of self-polymerization, may be supplied onto the substrate, and then moisture such as water vapor may be supplied onto the substrate. In this case, the isocyanate may be supplied onto the substrate in a liquid state, but it may be supplied in a mist state. When the isocyanate reacts with the moisture, the isocyanate is hydrolyzed to immediately produce polyurea.

As a method of supplying the isocyanate (liquid) onto the substrate, for example, the above-described spin coating can be used. The method of reacting the isocyanate with the moisture may include locating the substrate in an atmosphere heated to 80 degrees C. and a water vapor atmosphere (having relative humidity 100%), and reacting the water vapor with the isocyanate. An apparatus for carrying out such a water vapor process may employ a configuration in which a substrate mounting table with a built-in heater is disposed on the bottom portion of a processing container, and a water vapor discharge part for discharging water vapor over the entire region of the substrate in the form of a shower is installed above the substrate mounting table.

Examples

[Evaluation Test 1]

A polyurea film was formed on a substrate on which a silicon layer having a concave portion such as a groove formed therein is formed. The width of the groove was 5,000 µm and the depth of the groove was 300 nm. The polyurea film was formed to have a film thickness of 300 nm by alternately supplying 1,3-bis(isocyanatomethyl)cyclohexane (H6XDI) and 1,3-bis(aminomethyl)cyclohexane (H6XDA) in a gaseous state in a vacuum atmosphere. Subsequently, the substrate was heated at 330 degrees C. for 20 seconds while supplying a nitrogen gas as an inert gas under the vacuum atmosphere.

Figure 19A:
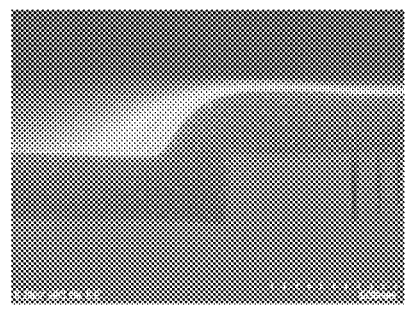
FIGS. 19A and 19B are scanning electron microscope photographs showing a cross section of a stepped substrate when a polyurea film is formed on the stepped substrate and is then heated.
Figure 19B:
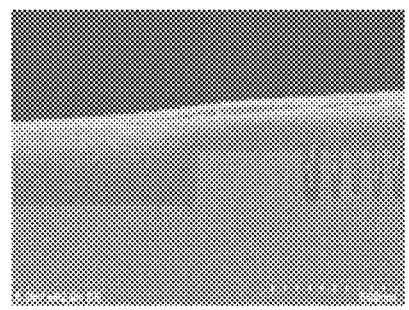

FIGS. 19A and 19B are SEM (Scanning Electron Microscope) photographs of a lateral surface of a substrate before and after heating, respectively. It can be seen from these photographs that a stepped portion is smoothed by heating the polyurea film so that the sectional shape and the film amount can be adjusted.

[Evaluation Test 2]

A polyurea film was formed on a substrate on which a silicon layer having a hole formed therein is formed. The diameter and depth of the hole were 80 nm and 2 µm, respectively. The polyurea film was formed in the same manner as in Evaluation Test 1. Subsequently, the substrate was heated at 260 degrees C. for 5 minutes while supplying a nitrogen gas to a processing atmosphere under a vacuum atmosphere.

Figure 20A:
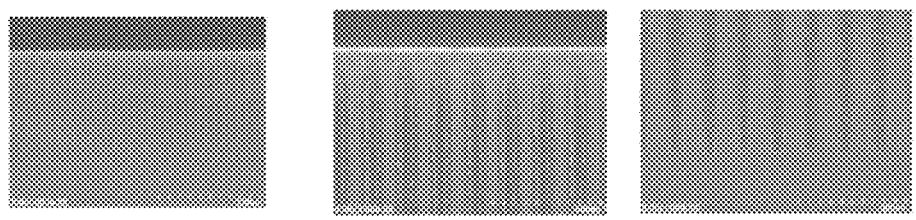
FIGS. 20A to 20C are graphs showing a distribution of atomic concentration in a surface portion of a substrate when a polyurea film is formed on a low dielectric constant film.
Figure 20B:
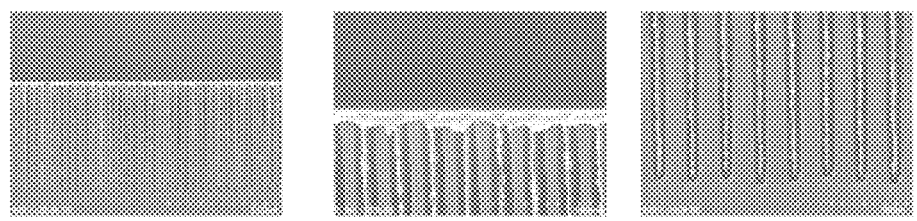
Figure 20C:
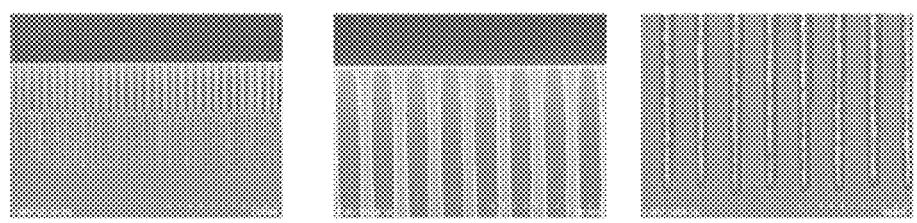

FIGS. 20A to 20C show SEM photographs of the section of the substrate. FIGS. 20A and 20B show states of the substrate before and after heating, respectively. In the horizontal arrangement of the photographs, the left photograph shows the entire hole, the center photograph shows the top of the hole, and the right photograph shows the bottom of the hole.

In the state shown in FIG. 20A, although the polyurea film adheres along the inner wall of the hole, the polyurea film does not fill the hole so that a seam is generated in the hole. In the state of FIG. 20B, the seam in the hole disappears. Therefore, it is confirmed that the polyurea film is depolymerized by heating the polyurea film, as mentioned earlier, and then is cooled to polymerize the monomer to fill the hole with polyurea.

Further, the substrate was heated at 300 degrees C. for 5 minutes in the same atmosphere. FIG. 20C is an SEM photograph of the section of the substrate after the heating process. It can be seen from this SEM photograph that the polyurea film formed on the surface of the substrate is removed (in detail, the polyurea film formed in the upper portion is also removed) and the polyurea film remains at the bottom portion of the hole. Accordingly, by adjusting the heating time and the heating temperature, it is confirmed that the hole is filled with the polyurea film and the film thickness of the polyurea film in the surface portion of the substrate can be adjusted.

[Evaluation Test 3]

H6XDI as isocyanate and H6XDA as amine were alternately supplied onto a substrate having a porous low dielectric constant film made of SiOC in a gaseous state for 3 seconds. This cycle was repeated 100 times to form a polyurea film. The composition of the surface portion of the substrate was examined by XPS (X-ray Photoelectron Spectroscopy). The result of the examination is as shown in FIG. 21.

Figure 21:
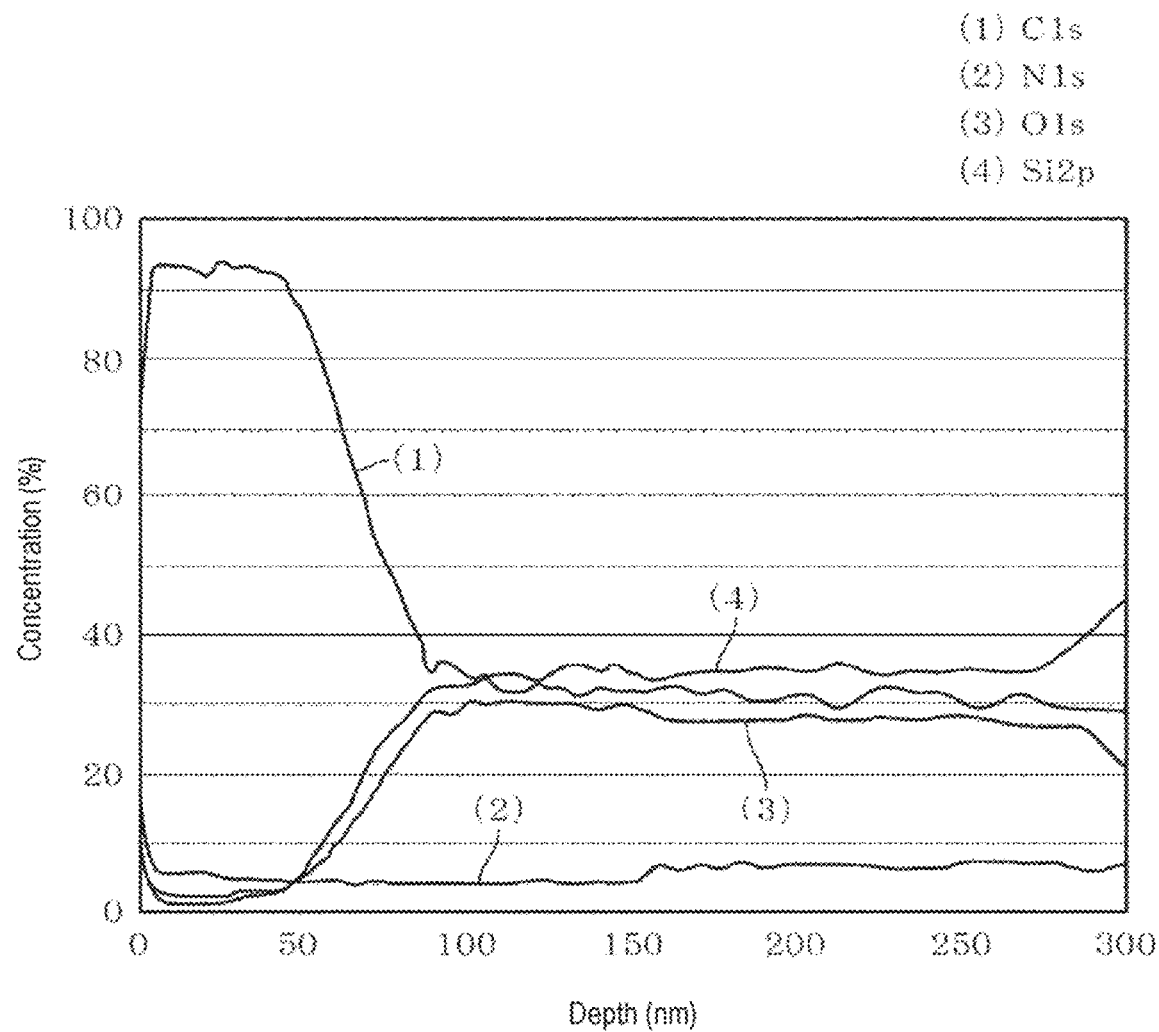
FIG. 21 is a graph showing a distribution of atomic concentration in a surface portion of a substrate when a polyurea film is formed on a low dielectric constant film and is then heated.

As can be seen from FIG. 21, Si and O are small and C is large in a portion close to the surface of the substrate, whereas C decreases and Si and O increase in a portion away from the surface. In addition, even when the depth changes, these atomic concentrations are nearly constant. Therefore, it can be seen that the polyurea film is laminated on the low dielectric constant film and the polyurea is filled in the hole of the low dielectric constant film.

Further, the substrate was heated at 280 degrees C. for 5 minutes in the same atmosphere as in Evaluation Test 1, and the composition of the surface portion of the substrate was examined. The result of the examination is as shown in FIG. 22. As can be seen from FIG. 22, since the concentrations of C, Si and O atoms are substantially constant from a portion close to the surface of the substrate to a portion far from the surface, a portion of the polyurea film laminated on the low dielectric constant film is removed.

In comparison in nitrogen concentration (2) in a region corresponding to the low dielectric constant film between FIG. 21 and FIG. 22, the nitrogen concentration in FIG. 22 is slightly higher than the nitrogen concentration in FIG. 21. Therefore, it can be seen that the filling of the hole of the low dielectric constant film with polyurea is insufficient in the state of FIG. 4B, whereas the hole of the low dielectric constant film is fully filled with polyurea in the state of FIG. 4D.

According to the present disclosure in some embodiments, a polymer having a urea bond is used as a sacrificial film. By heating this polymer, a reversible equilibrium reaction between depolymerization and polymerization occurs, the depolymerization is dominant with an increase in temperature, that is to say, the monomer state becomes dominant so that fluidity appears in the film. Therefore, by forming the sacrificial film and subsequently heating the sacrificial film, it is possible to carry out a process of changing the sectional shape of the sacrificial film and a process of adjusting the film thickness of the sacrificial film. Therefore, it is easy to adjust the shape and film amount of the sacrificial film, which can contribute to simplification of a process of manufacturing a semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device by performing a process on a substrate, comprising:

forming a sacrificial film made of a polymer having a urea bond on a surface of the substrate by supplying a precursor for polymerization onto the surface of the substrate;

subsequently, performing a step of changing a sectional shape of the sacrificial film and a step of reducing a film thickness of the sacrificial film by heating the sacrificial film at a temperature of 250° C. to 300° C. to partially depolymerize and fluidize the sacrificial film such that the sacrificial film can be used in the process as an etching mask;

subsequently, performing the process on the surface of the substrate; and subsequently, removing the sacrificial film.

2. The method of claim 1, wherein the removing the sacrificial film includes depolymerizing the polymer by heating the sacrificial film.

3. The method of claim 1, wherein a stepped portion is formed on the surface of the substrate on which the sacrificial film is formed, and wherein the step of changing the sectional shape of the sacrificial film includes smoothing a surface of the sacrificial film.

4. The method of claim 1, wherein a concave portion is formed in the surface of the substrate on which the sacrificial film is formed, wherein the step of changing the sectional shape of the sacrificial film includes fully filling a cavity formed in the concave portion, and wherein the step of adjusting the film thickness of the sacrificial film includes reducing a height of a surface of the sacrificial film in a state where the surface of the substrate is covered with the sacrificial film.

5. The method of claim 1, wherein a porous low dielectric constant film is formed on the surface of the substrate on which the sacrificial film is formed, wherein the forming a sacrificial film includes filling a hole formed in the low dielectric constant film with the polymer, wherein the step of changing the sectional shape of the sacrificial film includes filling a gap in the hole formed in the forming a sacrificial film with the polymer, and wherein the step of adjusting the film thickness of the sacrificial film includes removing the sacrificial film formed on the low dielectric constant film.

6. The method of claim 1, wherein the forming a sacrificial film includes supplying an isocyanate and an amine, which stay in a vapor state, onto the substrate, and heating the substrate to allow the isocyanate and the amine to undergo a polymerization reaction with each other.

7. The method of claim 1, wherein the forming a sacrificial film includes supplying an isocyanate and an amine, which stay in a liquid state, onto the substrate, and allowing the isocyanate and the amine to undergo a polymerization reaction with each other on the surface of the substrate.

8. The method of claim 1, wherein the forming a sacrificial film includes:

supplying an isocyanate staying in a liquid state or a mist onto the substrate;

supplying a moisture onto the substrate to hydrolyze the isocyanate and produce an amine; and allowing the isocyanate and the amine to undergo a polymerization reaction with each other.

* * * * *